United States Patent
Nakano et al.

(10) Patent No.: US 7,345,903 B2
(45) Date of Patent: Mar. 18, 2008

(54) NONVOLATILE SEMICONDUCTOR MEMORY DEVICE TO WHICH INFORMATION CAN BE WRITTEN ONLY ONCE

(75) Inventors: Hiroaki Nakano, Yokohama (JP); Toshimasa Namekawa, Tokyo (JP); Atsushi Nakayama, Kawasaki (JP); Osamu Wada, Yokohama (JP); Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/231,983

(22) Filed: Sep. 22, 2005

(65) Prior Publication Data

US 2006/0133127 A1  Jun. 22, 2006

(30) Foreign Application Priority Data

Dec. 17, 2004 (JP) .............................. 2004-366447

(51) Int. Cl.
 *G11C 17/00* (2006.01)
(52) U.S. Cl. ...................... 365/96; 365/225.7; 365/200
(58) Field of Classification Search .................. 365/96, 365/225.7, 200
See application file for complete search history.

(56) References Cited

U.S. PATENT DOCUMENTS 5,208,780 A * 5/1993 Iwase et al. ............. 365/225.7

6,671,040 B2 12/2003 Fong et al.

OTHER PUBLICATIONS

Hiroshi Ito, et al., "Pure CMOS One-time Programmable Memory using Gate-$O_x$ Anti-fuse", IEEE Custom Integrated Circuits Conference, 2004, pp. 469-472.
U.S. Appl. No. 11/231,795, filed Sep. 22, 2005, Nakayama et al.
U.S. Appl. No. 11/360,670, filed Feb. 24, 2006, Ito.
U.S. Appl. No. 11/531,118, filed Sep. 12, 2006, Nakano et al.
U.S. Appl. No. 11/733,933, filed Apr. 11, 2007, Namekawa et al.
U.S. Appl. No. 11/738,774, filed Apr. 23, 2007, Nakano et al.
U.S. Appl. No. 11/833,054, filed Aug. 2, 2007, Nameka et al.

* cited by examiner

*Primary Examiner*—Huan Hoang
(74) *Attorney, Agent, or Firm*—Oblon, Spivak, McClelland, Maier & Neustadt, P.C.

(57) ABSTRACT

A nonvolatile semiconductor memory device having a storage element which is programmed with information by breaking an insulating film of the storage element, includes a cell array including a plurality of storage cells arranged in matrix, each of the storage cells having the storage element and a selection switch connected in series to the storage element, and a row selection control circuit which activates a row selection line connected to a given number of storage cells. The device further includes a write control circuit which controls a voltage of each of data lines bit by bit in accordance with write data, the data lines being connected to a given number of storage cells connected to the row selection line activated by the row selection control circuit.

18 Claims, 5 Drawing Sheets

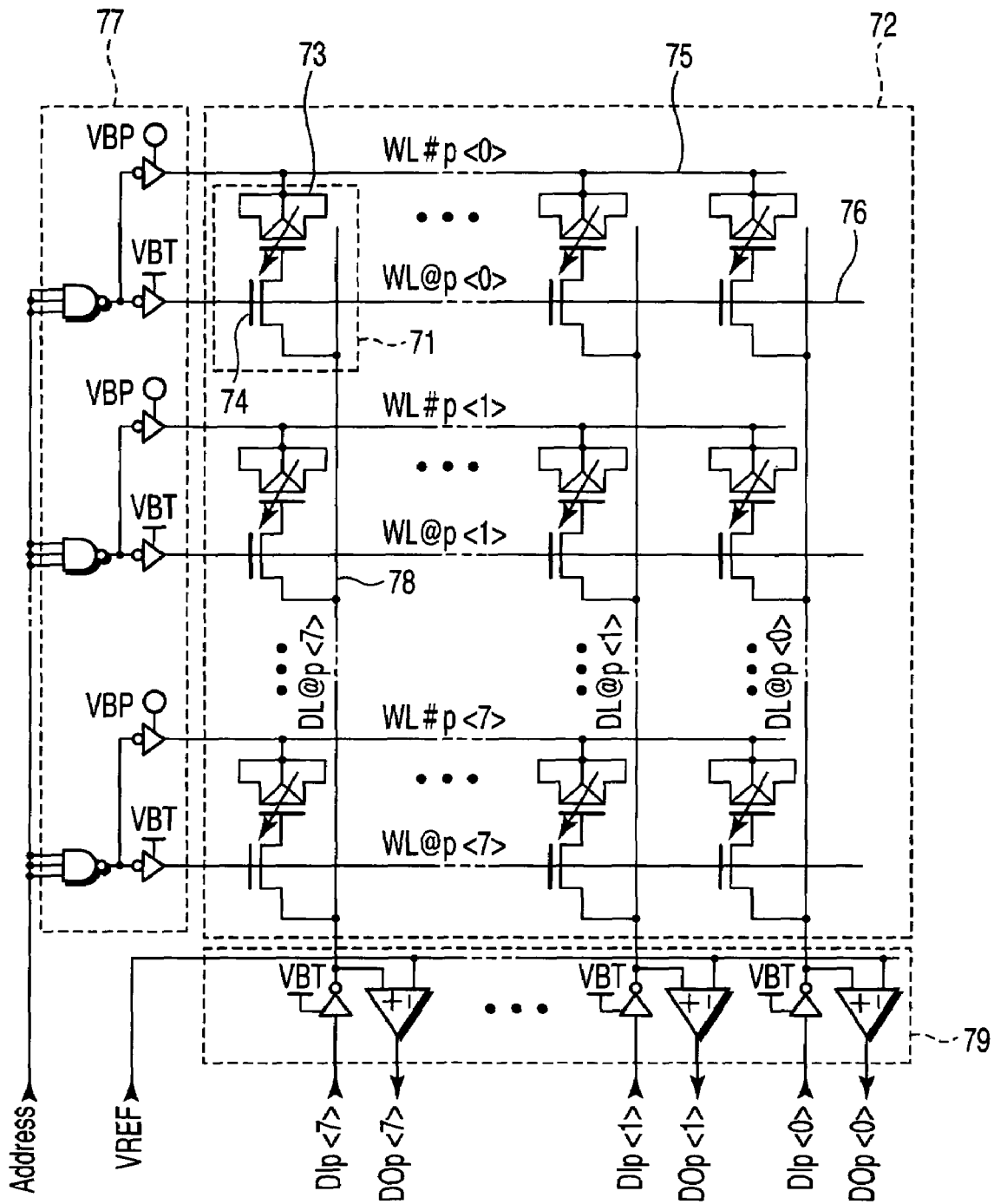
F I G. 5

NONVOLATILE SEMICONDUCTOR MEMORY DEVICE TO WHICH INFORMATION CAN BE WRITTEN ONLY ONCE

CROSS-REFERENCE TO RELATED APPLICATIONS

This application is based upon and claims the benefit of priority from prior Japanese Patent Application No. 2004-366447, filed Dec. 17, 2004, the entire contents of which are incorporated herein by reference.

BACKGROUND OF THE INVENTION

1. Field of the Invention

The present invention relates to a nonvolatile semiconductor memory device. More specifically, the invention relates to a one-time programmable (OTP) memory to which information can be written only once.

2. Description of the Related Art

Recently, an OTP memory using storage elements of an insulating film breakdown type, such as an electrical-fuse element (e-fuse element) and an anti-fuse element, has been proposed. The OTP memory stores information by applying a high voltage that exceeds the maximum rating to a semiconductor element having a metal oxide semiconductor (MOS) structure and breaking a gate insulating film of the semiconductor element. The OTP memory using the e-fuse element is used to store information "0" in the e-fuse element whose insulating film has not been broken and store information "1" in the e-fuse element whose insulating film has been broken. The OTP memory is also used to store information for replacing a defective element with a dynamic random access memory (DRAM) or the like.

Conventionally, an OTP memory using an optical-fuse element whose storage node is broken by laser beams has been often used. The e-fuse element has originally been used as an alternative to the optical-fuse element. The following example has been proposed: one storage cell is configured for each e-fuse element to include a sense circuit for reading information and a latch circuit for latching the information. See, for example, H. I to et al., "Pure CMOS One-Time Programmable Memory using Gate-Ox Anti-Fuse," Proceedings of the IEEE 2004 Custom Integrated Circuits Conference, pp. 469-472.

With the above configuration, however, each e-fuse element (or storage cell) includes a sense circuit and a latch circuit. This configuration has the advantage that the stably operated OTP memory can easily be designed, whereas it has the problem that the OTP memory greatly increases in size.

Particularly when a write control circuit is provided for each e-fuse element to control a series of write operations (program operations) such as precharge and application of stress, the OTP memory cannot be decreased in size though an operation of writing information to each e-fuse element can exactly be performed to achieve, for example, a complicated sequence.

BRIEF SUMMARY OF THE INVENTION

According to a first aspect of the present invention, there is provided a nonvolatile semiconductor memory device having a storage element which is programmed with information by breaking an insulating film of the storage element, comprising a cell array including a plurality of storage cells arranged in matrix, each of the storage cells having the storage element and a selection switch connected in series to the storage element, a row selection control circuit which activates a row selection line connected to a given number of storage cells, and a write control circuit which controls a voltage of each of data lines bit by bit in accordance with write data, the data lines being connected to a given number of storage cells connected to the row selection line activated by the row selection control circuit.

According to a second aspect of the present invention, there is provide a nonvolatile semiconductor memory device comprising a cell array including a plurality of storage cells arranged in matrix, each of the storage cells having a storage element which is programmed with information by breaking an insulating film thereof by applying a voltage, and a selection switch connected in series to the storage element, a row selection control circuit which activates a row selection line connected to a given number of storage cells, and a write control circuit which controls a voltage of each of data lines bit by bit in accordance with write data, the data lines being connected to the given number of storage cells connected to the row selection line activated by the row selection control circuit, wherein the write control circuit discharges data lines connected to storage cells to which "1" is to be written, one by one, the storage cells being included in the given number of storage cells connected to the row selection line activated by the row selection control circuit.

BRIEF DESCRIPTION OF THE SEVERAL VIEWS OF THE DRAWING

FIG. 5 is a circuit diagram of the principal parts of an OTP memory according to a second embodiment of the present invention.

DETAILED DESCRIPTION OF THE INVENTION

Embodiments of the present invention will be described below with reference to the accompanying drawings.

First Embodiment

Figure 1:
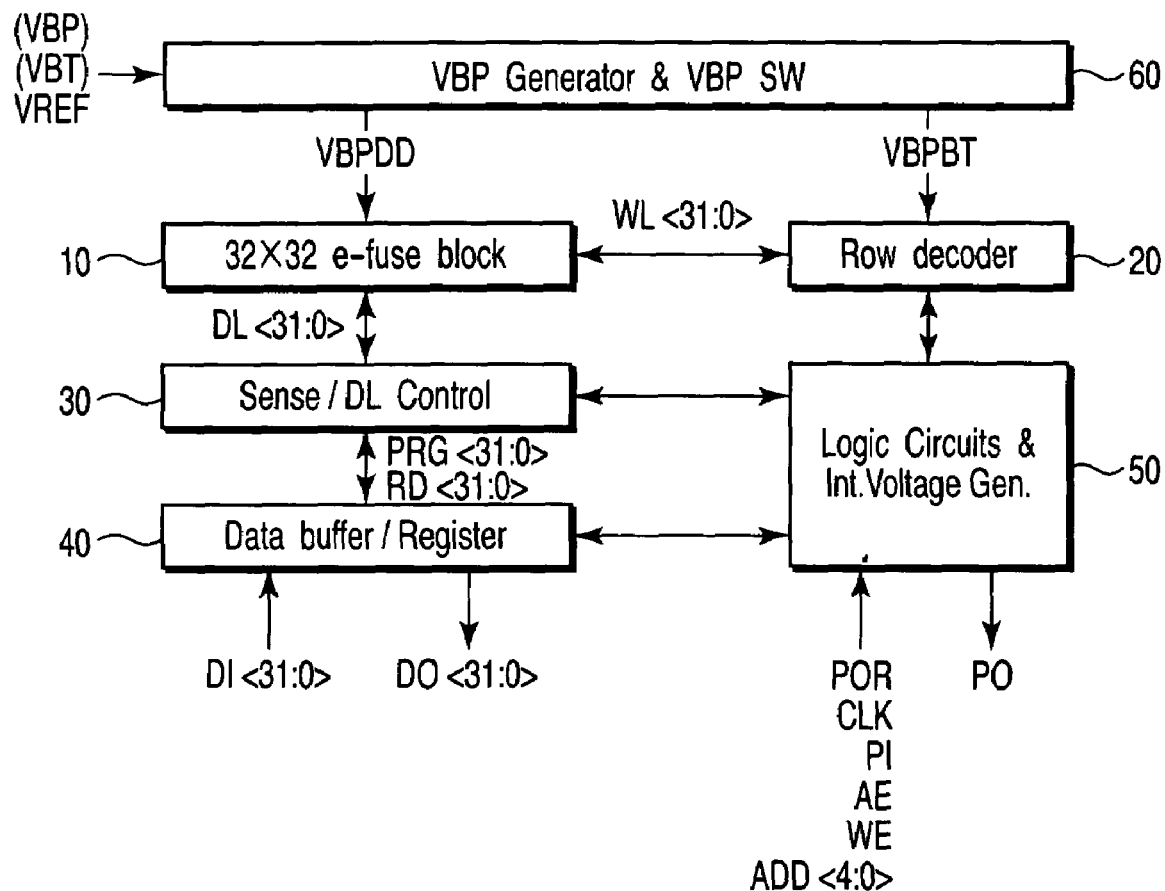
FIG. 1 is a block diagram of an OTP memory according to a first embodiment of the present invention.

FIG. 1 shows an OTP memory (nonvolatile semiconductor memory device) according to a first embodiment of the present invention, using an e-fuse element (a semiconductor element having a MOS structure) as a storage element. The OTP memory can be written with information only once. Assume here that the OTP memory includes a 1024-bit (32 bits×32 bits) cell array.

Referring to FIG. 1, the OTP memory includes a cell array 10, a row decoder unit 20 serving as a row selection control circuit, a sense/data line control circuit unit 30, a buffer/data register unit 40, an internal potential generation circuit/logic circuit unit (Logic Circuits & Int. Voltage Gen.) 50, and a voltage control block 60 having a high voltage generation circuit and a circuit for controlling a voltage to be applied to each of components of the OTP memory. In the first embodiment, the sense/data line control circuit unit 30 and buffer/data register unit 40 make up a write control circuit.

Figure 2:
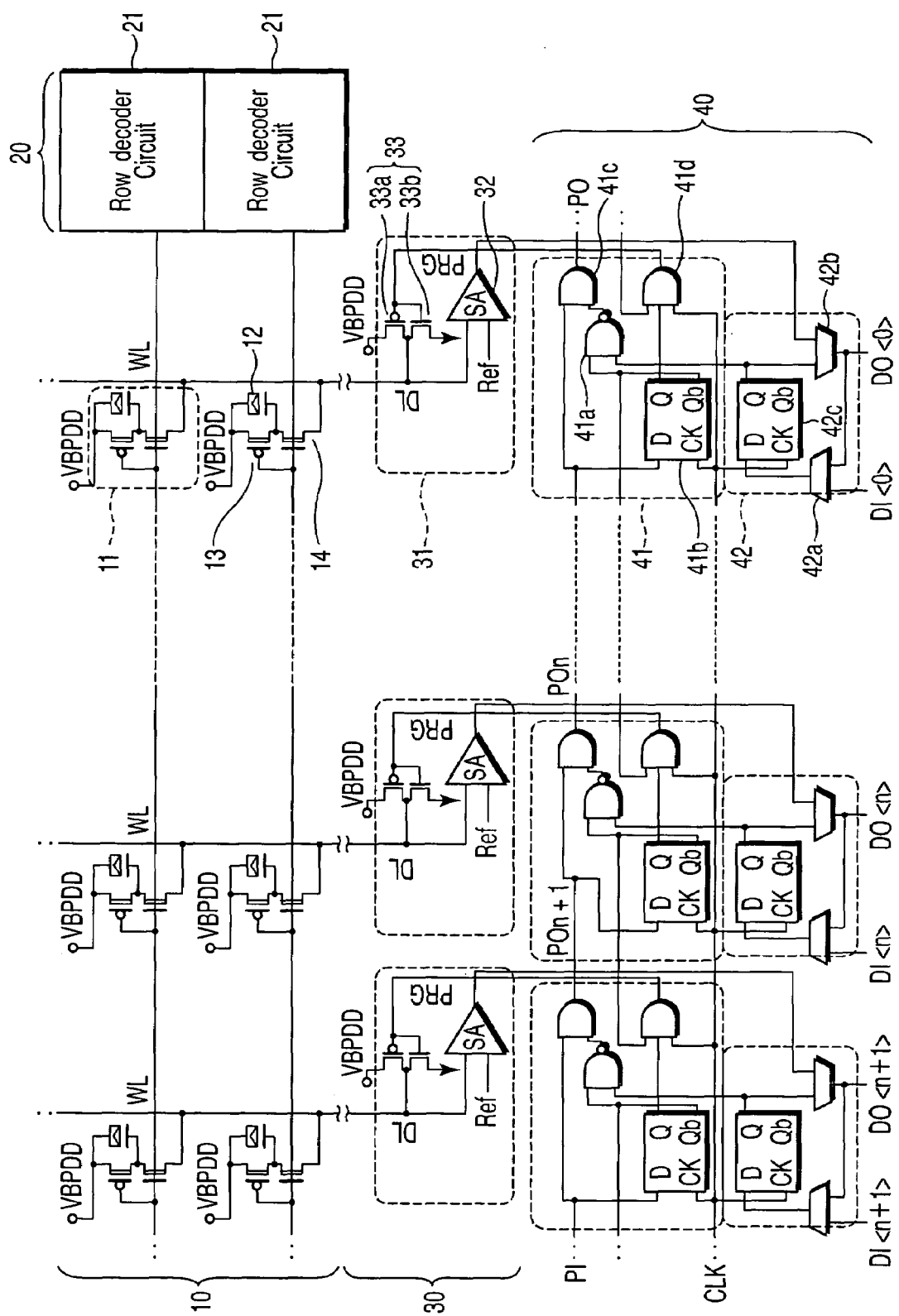
FIG. 2 is a circuit arrangement of the principal part of the OTP memory shown in FIG. 1.

As shown in FIG. 2, the cell array 10 includes a plurality of storage cells (storage units) 11 arranged in matrix (32 bits×32 bits). Each of the storage cells 11 has an electrical-fuse element (e-fuse element) 12 with two terminals, a p-type MOS transistor (protection transistor) 13 for relaxing an electric field to be applied to the e-fuse element 12 that is not programmed, and an n-type MOS transistor 14 serving as a selection transistor (selection switch) for controlling a connection of each of the e-fuse element 12 and the protection transistor 13 with a data line (column selection line) DL.

In each of the storage cells 11, the voltage control block 60 applies a potential VBPDD to one of terminals (substrate and source/drain) of the e-fuse element 12 and one of source and drain terminals of the protection transistor 13. The other terminal (gate) of the e-fuse element 12 is connected to a node between the other terminal of the protection transistor 13 and one of source and drain terminals of the n-type MOS transistor 14. The gate terminal of each of the transistors 13 and 14 is connected to any one of thirty-two word lines (row selection lines) WL (WL<31:0>). The other of the source and drain terminals of the transistor 14 is connected to any one of thirty-two data lines DL (DL<31:0>).

Of the storage cells 11 for 1024 bits arranged in matrix, the storage cells 11 for every 32 bits arranged in row direction are connected to a common word line WL. The word line WL is driven by its corresponding one of row decoder circuits 21 that make up the row decoder unit 20. If one word line WL is driven by its corresponding row decoder circuit 21, the storage cells 11 for 32 bits connected to the word line WL are selected at the same time.

Similarly, the storage cells 11 for every 32 bits arranged in column direction are connected to a common data line DL. The data line DL is controlled by its corresponding one of data sense and program circuits 31 of the sense/data line control circuit unit 30. If one data line DL is controlled by its corresponding circuit 31, a desired storage cell 11 can be selected from the storage cells 11 for 32 bits arranged in row direction.

The voltage control block 60 applies a potential VBPBT to the row decoder unit 20 as shown in FIG. 1.

The sense/data line control circuit unit 30 includes a plurality of data sense and program circuits 31. These circuits 31 are provided for their respective data lines DL as shown in FIG. 2. The data sense and program circuits 31 each have a sense amplifier (SA) 32 that senses information (e.g., a voltage value) read onto the data line DL from the storage cells 11 in comparison with a reference value Ref.

The data sense and program circuits 31 each have a write control circuit 33 as a data line control circuit to precharge the data line DL and write information (apply a stress). The write control circuit 33 includes a p-type MOS transistor 33a and an n-type MOS transistor 33b. These transistors 33a and 33b are connected in series between the potential VBPDD applied from the voltage control block 60 and the ground potential GND. The gate terminals of the transistors 33a and 33b are supplied with a program signal PRG. A node between the transistors 33a and 33b is connected to its corresponding data line DL. In other words, the data line DL can be precharged or discharged in accordance with the activation of the program signal PRG.

As illustrated in FIG. 1, the internal potential generation circuit/logic circuit unit 50 receives various control signals from a controller (not shown) to generate a new control signal and an internal potential used for controlling the sense amplifier 32.

As illustrated in FIG. 1, the voltage control block 60 includes a power supply circuit that generates and supplies a potential VBPDD and a potential VBPBT. The voltage control block 60 controls the potential VBPDD such that it is set at a potential VBP (a high voltage that exceeds the maximum rating of the e-fuse element) in program mode, it is set at a power supply voltage VDD in data read mode, and it is set at 0 V in standby mode. The voltage control block 60 also controls the potential VBPBT such that it is set at a potential VBP (a high voltage or a high potential that exceeds the maximum rating of the e-fuse element) in program mode, it is set at a power supply voltage VBT in data read mode (a potential or an intermediate potential of the word line WL in read mode), and it is set at 0 V in standby mode.

The buffer/data register unit 40 manages data that is to be transmitted/received to/from an external device. As shown in FIG. 2, the unit 40 includes a plurality of data control circuits 41 and a plurality of data holding circuits 42. The circuits 41 are provided for their respective data lines DL, as are the circuits 42.

The data holding circuits 42 each have multiplexers 42a and 42b and a flip-flop (F/F) circuit 42c. In each of the circuits 42, one input terminal of the multiplexer 42a is connected to a data input terminal DI (DI<31:0>). The other input terminal of the multiplexer 42a is connected to the output terminal of the multiplexer 42b, which is connected to a data output terminal DO (DO<31:0>). The output terminal of the multiplexer 42a is connected to a data input terminal D of the flip-flop circuit 42c. The data output terminal Q of the flip-flop circuit 42c is connected to one input terminal of a NAND circuit 41a of the corresponding data control circuit 41 and one input terminal of the multiplexer 42b. The output terminal of a sense amplifier 32 of the corresponding data sense and program circuit 31 is connected to the other input terminal of the multiplexer 42b.

The data control circuits 41 each have a flip-flop circuit 41b and AND circuits 41c and 41d as well as the NAND circuit 41a described above. The data output terminal Qb of the flip-flop circuit 41b is connected to the other input terminal of the NAND circuit 41a. This data output terminal Qb is also connected to the first input terminal of the AND circuit 41d that configures a preceding-stage data control circuit 41.

The output terminal of the NAND circuit 41a is connected to one input terminal of the AND circuit 41c. The output terminal of the AND circuit 41c that configures the preceding-stage data control circuit 41 is connected to the other input terminal of the AND circuit 41c.

A program start signal PI is supplied to the other input terminal of an AND circuit 41c of a data control circuit 41 on the first stage. In each of the data control circuits 41 on the stages subsequent to the first stage, a program end signal PO (PO<31:0>) is supplied to the other input terminal of the AND circuit 41c from an AND circuit 41c of the preceding-stage data control circuit. This program end signal PO (PO<31:0>), which includes the program start signal PI, is also supplied to the data input terminal D of the flip-flop circuit 41b.

The data output terminal Q of the flip-flop circuit 41b is connected to the second input terminal of the AND circuit 41d. A clock signal CLK is supplied to the third input terminal of the AND circuit 41d as well as the clock input terminal CK of the flip-flop circuit 41b. The output terminal of the AND circuit 41*d* is connected to the gate terminals of the p-type and n-type MOS transistors 33*a* and 33*b* that make up a write control circuit 33 of the corresponding data sense and program circuit 31 in order to supply the program signal PRG.

The clock input terminals CK of the flip-flop circuits 41*b* and 42*c* are supplied with a common clock signal CLK from the controller (not shown).

In the data control circuit 41, if the level of a feedback signal supplied from the subsequent stage (a signal output from the data output terminal Qb of the flip-flop circuit 41*b*) is high when the program start signal PI reaches a high (H) level, the program signal PRG, which is an output of the AND circuit 41*d*, reaches a high level (to start a program operation).

The program signal PRG reaches a low (L) level when the clock signal CLK drops to a low level, whereas the program start signal PI and program end signal PO both reach a high level when the next clock signal is received. The feedback signal (Qb) from the subsequent stage therefore reaches a low level. The program signal PRG does not return to the high level.

Here is a specific description of the operation of the buffer/data register unit 40. For the sake of convenience, a buffer/data register unit 40 that is connected to a data input terminal DI <n+1> and a data output terminal DO <n+1> will be described as a first-stage unit.

If the level of a signal (write data) input to the data input terminal DI <n+1> is low when the program start signal PI reaches a high level, the output signal of the data output terminal Q of the flip-flop circuit 42*c* of the corresponding data holding circuit 42 reaches a low level. Thus, a high-level signal is output as a program end signal PO from the output terminal of the AND circuit 41*c* of the data control circuit 41 connected to the data holding circuit 42. When the flip-flop circuit 41*b* in the first-stage data control circuit 41 receives a high-level signal as a program start signal PI in synchronization with a clock signal CLK, a feedback signal (Qb) supplied from the subsequent-stage data control circuit 41 reaches a low level. The program signal PRG supplied from the AND circuit 41*d* of the first-stage data control circuit 41 remains at a low level.

When the first-stage data control circuit 41 ends its operation, the operation shifts to a subsequent-stage unit such as a buffer/data register unit 40 to which the data input terminal DI <n+1> and data output terminal DO <n> are connected. If the level of a signal input to the data input terminal DI <n> of the subsequent-stage unit is low, the program signal PRG supplied from the AND circuit 41*d* of the data control circuit 41 remains at a low level, and the operation further shifts to a subsequent-stage unit.

Of the above operations, the operation that the program end signal PO reaches a high level if the level of a signal input to the data input terminal DI is low when the program start signal PI reaches a high level is performed without depending upon the clock signal CLK. If units whose data input terminals DI are supplied with low-level signals are arranged continuously, they all perform the same operation (to output a high-level signal as a program end signal PO) at once when they receive a clock signal. If only the signal input to the data input terminal DI <0> is at a high level, a unit with data input terminal DI <1> to a unit with data input terminal DI <n+1> perform the same operation of holding the program signal PRG at a low level. The program operation of a unit with data input terminal DI <0> starts in response to the first clock after the program start signal PI.

In contrast, if a signal input to the data input terminal DI <n+1> reaches a high level when the level of the program start signal PI is high, a high-level program end signal PO is output from the output terminal of the AND circuit 41*c* of the data control circuit 41 connected to the data holding circuit 42. When the flip-flop circuit 41*b* in the first-stage data control circuit 41 receives a high-level program start signal PI in synchronization with the clock signal CLK, a feedback signal (Qb) supplied from the subsequent-stage data control circuit 41 remains at a high level until the next clock. In synchronization with the clock signal CLK, the output signal of data output terminal Q of the flip-flop circuit 41*b* of the data control circuit 41 in the present unit reaches a high level. The program signal PRG supplied from the AND circuit 41*d* of the first-stage data control circuit 41 reaches a high level while the level of the clock signal CLK is high.

The program signal PRG reaches a low level when the clock signal CLK does a low level. When the next clock is generated, the feedback signal (Qb) supplied from the subsequent-stage data control circuit 41 reaches a low level. Thus, the program signal PRG does not return to the high level.

Similarly, when write data supplied to the data input terminal DI is "0", an operation of programming the corresponding storage cell 11 is skipped. Only when write data is "1", the corresponding storage cell 11 is programmed.

The OTP memory so configured is so controlled that the voltage of a data line corresponding to a data input terminal DI becomes low when write data supplied to the data input terminal DI is "1". In other words, of all data lines DL precharged with a high voltage, the data lines DL connected to storage cells 11 to which "1" is to be written are discharged one by one in sequence from the higher order (or lower order). Information can thus be written to the storage cells 11 for 32 bits, which are arranged in the row direction, bit by bit from the higher order (or lower order).

In the foregoing OTP memory using a plurality of e-fuse elements 12 as storage elements, the elements 12 are arranged in matrix for their respective cells, and a sense amplifier 32 and a circuit block (e.g., a write control circuit 33) are shared with each other for each of the data lines DL. The OTP memory can thus be decreased in area more greatly than the conventional one.

In particular, the program operations are performed bit by bit in sequence from their corresponding higher-order (or lower-order) data lines DL. Even though a sense amplifier 32 and a circuit block are shared with each other for each of data lines, the program operations can be performed at almost the same speed as conventional.

In the first embodiment, a potential VBPDD is applied to all the storage cells 11 when they are programmed and thus a high potential VBP is applied to a non-selected storage cell 11 that is not to be programmed. However, the protection transistor 13 prevents a high electric field (high potential VBP) from being applied to both ends of the e-fuse element 12 of the non-selected storage cell 11.

Figure 3:
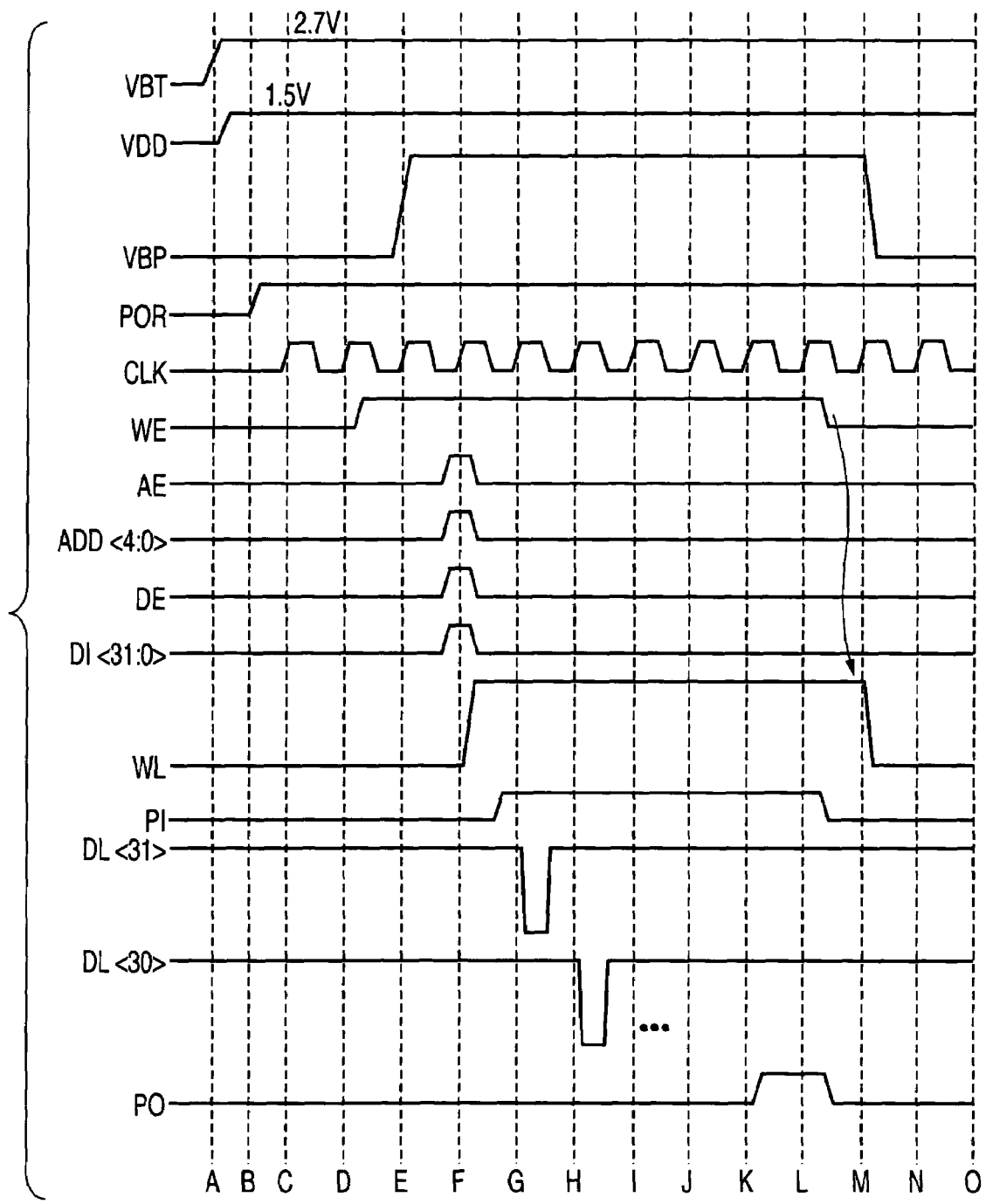
FIG. 3 is a timing chart illustrating a program operation of the OTP memory shown in FIG. 1.

FIG. 3 shows operation timing of the OTP memory described above. The data write operation (program operation) of the OTP memory will be described with reference to FIG. 3. In the OTP memory, a power supply system (not shown) supplies at least three power supply voltages: a power supply voltage VDD of a logic circuit or the like, an intermediate potential VBT used for controlling the word line WL to transfer information of the e-fuse element 12 with efficiency in data read mode, and a high potential VBP for breaking the gate insulating film of the e-fuse element 12.

At timing "A", a power supply voltage VDD is applied to operate the OTP memory. This power supply voltage VDD is applied to the voltage control block 60, internal potential generation circuit/logic circuit unit 50, buffer/data register unit 40, row decoder unit 20, sense/data line control circuit unit 30, and the like.

A power supply voltage VBT is applied to the voltage control block 60. At timing "B", a reset signal POR for resetting the OTP memory, which is input to the unit 50 from the controller, is raised to a high level. When the reset signal POR is at a low level, the OTP memory is reset. Accordingly, the reset of the OTP memory is released.

A clock signal CLK is input to the internal potential generation circuit/logic circuit unit 50 at timing "C" and then a program mode entry signal WE is input thereto at timing "D". When the signal WE is synchronized with the clock signal CLK at timing "E" and input to the unit 50, a high potential VBP starts to be applied to a desired node (e.g., both ends of the e-fuse element 12) to break a gate insulating film of the e-fuse element 12 in each of the storage cells 11.

At timing "F", a row address selection signal AE and a row address signal ADD <4:0> are input to the unit 50. The row decoder unit 20 selects and drives a desired word line WL. The potential of a word line WL selected and driven in program mode remains at a high level until the program mode entry signal WE drops to a low level.

At the same timing "F", write data is input to the buffer/data register unit 40 from the data input terminal DI <31:0> while a data input enable signal DE is input to the internal potential generation circuit/logic circuit unit 50. The input write data is synchronized with the clock signal CLK at timing "F" and stored in the flip-flop circuit 42c of each of the data holding circuits 42 corresponding to the data lines DL.

A high-level program start signal PI is input to the unit 50 at timing "G" after the word line WL reaches a high level. The actual program operations start. In the first embodiment, the program operations are performed bit by bit in sequence from their corresponding higher-order (or lower-order) data lines DL under the control of the units 30 and 40.

The program operations are performed in synchronization with the period of a clock signal CLK. While the clock signal CLK is at a high level, the e-fuse element 12 is subjected to a high voltage to break a gate insulating film. While the clock signal CLK is at a low level, a high potential VBP is set up and the data lines DL are precharged.

When write data stored in the flip-flop circuit 42c of the data holding circuit 42 is "0", a program operation for a corresponding data line DL is skipped and a subsequent data line DL is controlled. The program time required when thirty-two data lines DL intersect one word line WL is maximized when "1" is written to all the storage cells 11, and the maximum program time is thirty-two clock periods. In contrast, the program time is minimized when "0" is written to all the storage cells 11, and the minimum program time is a zero clock period.

When the program operation is completed for all the data lines DL, the program end signal PO output from the internal potential generation circuit/logic circuit unit 50 reaches a high level. The completion of a series of program operations is notified of the controller.

After the data lines DL are all precharged with a high voltage, data lines DL of storage cells 11 corresponding to bits, to which "1" is to be written, are discharged to a low voltage one by one thereby to perform a write operation bit by bit. The program operations can thus be performed at almost the same speed as that in a conventional case where a data write control circuit is provided for each of the storage cells 11.

Figure 4:
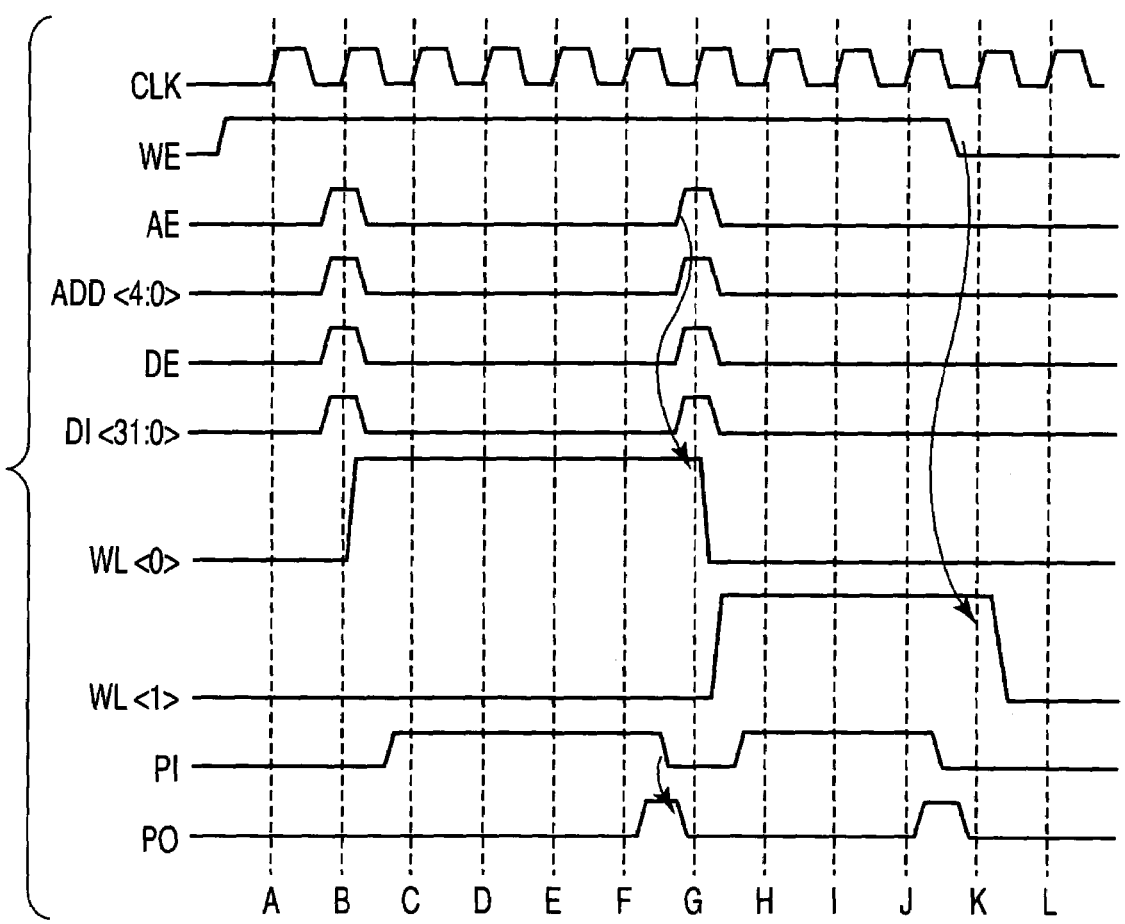
FIG. 4 is a timing chart illustrating an operation of the OTP memory shown in FIG. 1, using an example in which a program operation is performed continuously for a plurality of word line.

FIG. 4 shows the operation timing of the foregoing OTP memory, using an example in which a program operation is performed continuously for a plurality of word lines WL. Since the power-on sequence is the same as that of FIG. 3, its description is omitted here.

Assume first that a program operation is performed for a word line WL <0>. As this program operation is completed, a program end signal PO reaches a high level at timing "F". The controller senses the high-level program end signal PO supplied from the internal potential generation circuit/logic circuit unit 50 to drop a program start signal PI to a low level or reset the program end signal PO to a low level, thereby preparing for the next program operation.

At timing "G", a program operation starts for a subsequent word line WL <1>. In other words, a row address selection signal AE and a row address signal ADD <4:0> are input to the unit 50. The row decoder unit 20 selects and drives a desired word line WL <1>.

At the same timing "G", write data is input to the buffer/data register unit 40 from the data input terminal DI <31:0> while a data input enable signal DE is input to the internal potential generation circuit/logic circuit unit 50. This input write data is held in the flip-flop circuit 42c of the corresponding data holding circuit 42.

At timing "H", a high-level program start signal PI is input to the internal potential generation circuit/logic circuit unit 50. Accordingly, the actual program operations start.

If the program operation is completed for the word line WL <1>, a program end signal PO supplied from the unit 50 reaches a high level. The controller drops the program start signal PI to a low level and resets the program end signal PO to a low level. The controller also drops the program mode entry signal WE to a low level. A series of program operations is completed accordingly.

In the program operations, a large amount of current flows when an insulating film is broken and thus a plurality of e-fuse elements are difficult to program at the same time. Even though the e-fuse elements are arranged in matrix as in the first embodiment, no time required to program the e-fuse elements is lengthened.

As has been described in detail, when a plurality of word lines are selected in sequence to repeat the program operation, they need to be switched. Time required for the program operations is lengthened by the time for switching the word lines, which is not a serious problem.

Even though the sense amplifier and the circuit block are shared with each other for each of the data lines and the storage cells are arranged in matrix, the program operations can be performed with almost no loss of time by switching the word lines continuously.

Second Embodiment

FIG. 5 shows the principal parts of an OTP memory (a nonvolatile semiconductor memory device) according to a second embodiment of the present invention, using an e-fuse element as a storage element. As the principal parts, a cell array, a row decoder and a column data buffer will be described. Their configurations are as follows. Of the nodes (substrate, source and drain) of e-fuse elements to which a high voltage is applied, a high voltage is applied to the nodes of e-fuse elements in a row whose word lines are selected to prevent a high voltage from being applied to an unselected storage cell and thus relax the stress applied thereto.

Referring to FIG. 5, a plurality of storage cells 71 are arranged in matrix to form a cell array 72. The storage cells 71 are each configured by an electrical-fuse element (e-fuse element) 73 having two terminals and a selection switch 74 that is configured by an n-type MOS transistor.

A given number of (eight in this embodiment) storage cells 71 are arranged in each row. In each of the storage cells 71, one of the terminals of the e-fuse element 73 is connected to its corresponding one of high-potential row selection lines (WL#p <0 to 7>) 75 to which a high potential (e.g., VBP) is applied. The gate terminal of the selection switch 74 is connected to its corresponding one of intermediate-potential row selection lines (WL@p <0 to 7>) 76 to which an intermediate potential (e.g., VBT) is applied. The selection lines 75 and 76 are connected to a row decoder 77 and selectively activated. The high-potential row selection lines 75 break the gate insulating films of the e-fuse elements 73, while the intermediate-potential row selection lines 76 activate the selection switches 74.

On the other hand, a given number of (eight in this embodiment) storage cells 71 are arranged in each column. In each of the storage cells 71, the input/output terminal (one of source and drain terminals) is connected to its corresponding one of column data lines (DL@p <0 to 7>) 78 serving as column selection lines, which cross the selection lines 75 and 76 at right angles. The column data lines 78 are connected to the column data buffer 79 to amplify and control input/output data signals.

The OTP memory with the above configuration can also greatly be decreased in area. Of the storage cells 71 activated by the row selection lines 75 and 76, a column data line 78 connected to a storage cell 71 to which data is to be written is kept at a low potential and a column data line 78 connected to a storage cell 71 to which no data is written is kept at an intermediate potential. A satisfactory program operation can thus be performed.

In each of the embodiments, it is favorable that the nonvolatile semiconductor memory device is used for storing information to replace a defective element in, for example, a DRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device having a storage element which is programmed with information by breaking an insulating film of the storage element, comprising:
   a cell array including a plurality of storage cells arranged in matrix, each of the storage cells having the storage element and a selection switch connected in series to the storage element;
   a row selection control circuit which activates a row selection line connected to a given number of storage cells; and
   a write control circuit which controls a voltage of each of data lines bit by bit in accordance with write data, the data lines being connected to the given number of storage cells connected to the row selection line activated by the row selection control circuit, wherein the write control circuit programs the given number of storage cells, which are connected to the row selection line activated by the row selection control circuit, with information corresponding to the write data by discharging data lines connected to storage cells to which "1" is to be written, one by one.

2. The nonvolatile semiconductor memory device according to claim 1, wherein the write control circuit is provided for each of the data lines and includes a buffer/data register unit having a data holding circuit and a data control circuit and a sense/data line control circuit unit having a sense amplifier and a data line control circuit.

3. The nonvolatile semiconductor memory device according to claim 1, wherein the storage cells each have a protection transistor to relax an electric field that is applied to the storage element when the storage element is unprogrammed.

4. The nonvolatile semiconductor memory device according to claim 3, wherein the protection transistor is a p-type metal oxide semiconductor (MOS) transistor connected in parallel to the storage element.

5. The nonvolatile semiconductor memory device according to claim 1, wherein the storage element is an electrical-fuse element having two terminals, which is programmed with information "0" before the insulating film is broken and programmed with information "1" after the insulating film is broken.

6. The nonvolatile semiconductor memory device according to claim 1, which is a one-time programmable (OTP) memory to which information is written only once.

7. The nonvolatile semiconductor memory device according to claim 1, which is used to store information to replace a defective element in a dynamic random access memory (DRAM).

8. The nonvolatile semiconductor memory device according to claim 1, wherein the row selection line includes a first selection line to break the insulating film of the storage element and a second selection line to activate the selection switch.

9. The nonvolatile semiconductor memory device according to claim 1, further comprising a high-voltage generation circuit which applies a voltage that is not lower than a rating of the storage element to the data line connected to a given number of storage cells through selection switches, the given number of storage cells being included in the storage cells of the cell array.

10. A nonvolatile semiconductor memory device comprising:
    a cell array including a plurality of storage cells arranged in matrix, each of the storage cells having a storage element which is programmed with information by breaking an insulating film thereof by applying a voltage, and a selection switch connected in series to the storage element;
    a row selection control circuit which activates a row selection line connected to a given number of storage cells; and
    a write control circuit which controls a voltage of each of data lines bit by bit in accordance with write data, the data lines being connected to the given number of storage cells connected to the row selection line activated by the row selection control circuit,
    wherein the write control circuit discharges data lines connected to storage cells to which "1" is to be written, one by one, the storage cells being included in the given number of storage cells connected to the row selection line activated by the row selection control circuit.

11. The nonvolatile semiconductor memory device according to claim 10, wherein the write control circuit is provided for each of the data lines and includes a buffer/data register unit having a data holding circuit and a data control circuit and a sense/data line control circuit unit having a sense amplifier and a data line control circuit.

12. The nonvolatile semiconductor memory device according to claim 10, wherein the storage cells each have a protection transistor to relax an electric field that is applied to the storage element when the storage element is unprogrammed.

13. The nonvolatile semiconductor memory device according to claim 12, wherein the protection transistor is a p-type metal oxide semiconductor (MOS) transistor connected in parallel to the storage element.

14. The nonvolatile semiconductor memory device according to claim 10, wherein the storage element is an electrical-fuse element having two terminals, which is programmed with information "0" before the insulating film is broken and programmed with information "1" after the insulating film is broken.

15. The nonvolatile semiconductor memory device according to claim 10, which is a one-time programmable (OTP) memory to which information is written only once.

16. The nonvolatile semiconductor memory device according to claim 10, which is used to store information to replace a defective element in a dynamic random access memory (DRAM).

17. The nonvolatile semiconductor memory device according to claim 10, wherein the row selection line includes a first selection line to break the insulating film of the storage element and a second selection line to activate the selection switch.

18. The nonvolatile semiconductor memory device according to claim 10, further comprising a high-voltage generation circuit which applies a voltage that is not lower than a rating of the storage element to the data line connected to a given number of storage cells through selection switches, the given number of storage cells being included in the storage cells of the cell array.

* * * * *